United States Patent
Deak et al.

(10) Patent No.: US 9,575,143 B2
(45) Date of Patent: Feb. 21, 2017

(54) SINGLE-CHIP TWO-AXIS MAGNETIC FIELD SENSOR

(75) Inventors: James Geza Deak, Zhangjiagang (CN); Insik Jin, Zhangjiagang (CN); Weifeng Shen, Zhangjiagang (CN); Xiaofeng Lei, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 167 days.

(21) Appl. No.: 14/110,106

(22) PCT Filed: May 23, 2012

(86) PCT No.: PCT/CN2012/075956
§ 371 (c)(1),
(2), (4) Date: Oct. 4, 2013

(87) PCT Pub. No.: WO2012/136158
PCT Pub. Date: Oct. 11, 2012

(65) Prior Publication Data
US 2014/0035573 A1 Feb. 6, 2014

(30) Foreign Application Priority Data

Apr. 6, 2011 (CN) .......................... 2011 1 0084594
Oct. 18, 2011 (CN) .......................... 2011 1 0315913

(51) Int. Cl.
*G01R 33/09* (2006.01)

(52) U.S. Cl.
CPC .................................. *G01R 33/098* (2013.01)

(58) Field of Classification Search
CPC ..... G01R 33/02; G01R 33/098; G01R 33/093; G01R 15/205; G01R 33/0023; G01R 33/0029; G01R 33/0035; G01R 33/09; B82Y 25/00; H01L 43/08; H01L 27/22
(Continued)

(56) References Cited

U.S. PATENT DOCUMENTS 6,791,807 B1* 9/2004 Hikami et al. ................ 360/328
8,134,361 B2 3/2012 Azumi et al.
(Continued)

FOREIGN PATENT DOCUMENTS

CN 101308199 A 11/2008
CN 101325210 A 12/2008
(Continued)

OTHER PUBLICATIONS

"International Application Serial No. PCT/CN2012/075956, International Preliminary Report on Patentability dated Oct. 8, 2013", (w/ English Translation), 15 pgs.
(Continued)

*Primary Examiner* — Arleen M Vazquez
*Assistant Examiner* — Brent J Andrews
(74) *Attorney, Agent, or Firm* — Schwegman Lundberg & Woessner, P.A.

(57) ABSTRACT

The present invention discloses a design for a single-chip dual-axis magnetic field sensor, based on magnetic tunnel junction (MTJ) elements and permanent magnets integrated on a semiconductor substrate to produce two types of sensor bridges that detect orthogonal magnetic field components. The orthogonal magnetic field component detection capability results from the different types of sensor bridges that can be produced by varying the shape of the MTJ elements and the bias fields that can be created by permanent magnets. Because the permanent magnets can create orthogonal bias fields on the different sensor bridges, it is possible to use a
(Continued)

single pinned layer to set direction for both sensor bridges. This is advantageous because it permits the two-axis sensor to be fabricated on a single semiconductor chip without the need for specialized processing technology such as local heating, or deposition of multiple magnetoresistive films with different pinned layers setting directions.

20 Claims, 8 Drawing Sheets

(58) Field of Classification Search
USPC .......................................................... 324/252
See application file for complete search history.

(56) References Cited

U.S. PATENT DOCUMENTS

| 8,237,437 | B2 | 8/2012 | Engel et al. | |
|---|---|---|---|---|
| 2003/0020471 | A1* | 1/2003 | Kohlstedt | B82Y 25/00 324/252 |
| 2003/0107373 | A1* | 6/2003 | Van Zon | G01R 33/09 324/252 |
| 2006/0039188 | A1* | 2/2006 | Ju | 365/158 |
| 2010/0001723 | A1* | 1/2010 | Van Zon | G01R 33/09 324/252 |
| 2010/0211347 | A1* | 8/2010 | Friedrich et al. | 702/117 |
| 2011/0007430 | A1* | 1/2011 | Zheng et al. | 360/324.2 |
| 2011/0074406 | A1* | 3/2011 | Mather et al. | 324/252 |
| 2011/0089941 | A1* | 4/2011 | Sasaki | B82Y 25/00 324/252 |
| 2012/0068279 | A1* | 3/2012 | Lai et al. | 257/421 |
| 2012/0091992 | A1* | 4/2012 | Guziak | 324/101 |
| 2012/0212217 | A1* | 8/2012 | Engel et al. | 324/252 |
| 2014/0225605 | A1 | 8/2014 | Lei et al. | |
| 2014/0247042 | A1 | 9/2014 | Lei et al. | |

FOREIGN PATENT DOCUMENTS

| CN | 102057487 A | | 5/2011 | |
|---|---|---|---|---|
| CN | 102129053 A | | 7/2011 | |
| CN | 102208530 A | * | 10/2011 | ........... G01R 33/098 |
| CN | 102208530 A | | 10/2011 | |
| CN | 102226835 A | | 10/2011 | |
| CN | 102385043 A | | 3/2012 | |
| CN | 102426344 A | | 4/2012 | |
| CN | 102435963 A | | 5/2012 | |
| JP | 2006-098320 A | | 4/2006 | |
| WO | WO-2012-136158 A2 | | 10/2012 | |

OTHER PUBLICATIONS

"International Application Serial No. PCT/CN2012/075956, International Search Report mailed Aug. 30, 2012", (w/ English Translation), 5 pgs.

"International Application Serial No. PCT/CN2012/075956, Written Opinion mailed Aug. 30, 2012", (w/ English Translation), 13 pgs.

* cited by examiner

SINGLE-CHIP TWO-AXIS MAGNETIC FIELD SENSOR

CROSS-REFERENCE TO A RELATED APPLICATION

This application is a 35 U.S.C. §371 national phase application of PCT/CN2012/075956, filed on May 23, 2012, which claims priority to a Chinese Patent Application No. CN201110084594.5, filed on Apr. 16, 2011, and a Chinese Patent Application No. CN201110315913, filed on Oct. 18, 2011, incorporated herein by reference in its entirety.

FIELD OF THE TECHNOLOGY

The present invention relates to the design and fabrication process of magnetic field sensor bridges, with particular emphasis on single-chip two-axis magnetic field sensors.

BACKGROUND ART

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to offset in the magnetoresistive response of MTJ sensors, and difficulty in matching the magnetoresistive response of MTJ elements when combined to form bridge sensors have proven difficult. Likewise, the manufacturing process for two-axis magnetic field sensors integrated on a single semiconductor substrate has proven difficult.

SUMMARY OF THE INVENTION

The present invention discloses a method for mass production of two-axis linear sensor ships utilizing standard semiconductor processes. The two-axis sensor may utilize tunneling magnetoresistance (TMR) elements or giant magnetoresistance (GMR) elements deposited on the same semiconductor substrate to form two different magnetic sensor bridges for sensing orthogonal components of the magnetic field. The two-axis sensing capability depends on sensor geometry. The permanent magnet makes the sensor more stable, the permanent magnet may be initialized at wafer level, or after packaging. The permanent magnet biased bridges utilize a pinned layer in the sense and reference elements that is initialized in the same direction, so no special processing such as local magnetic annealing or deposition of multiple magnetic material layers is required.

The present invention discloses a single-chip two-axis magnetic field sensor. It includes a referenced bridge sensor that has a sensitive direction along the Y-axis, and a push-pull bridge sensor that has a sensitive direction along the X-axis, the X-axis and the Y-axis are mutually orthogonal.

Preferably, the referenced bridge sensor is a referenced full-bridge sensor, that comprises reference elements and sense elements; and the push-pull sensor is full-bridge comprised only of sense elements.

Additionally, the single-chip two-axis sensor further comprising permanent magnets used to create different bias magnetic fields on the reference elements and sense elements of the referenced bridge in order to make the sensitivity of the reference elements and sense elements of the referenced full bridge sensor different, and also to bias the magnetization direction of the free layer of the sense elements of the push-pull full-bridge sensor.

Moreover, the referenced full-bridge sensor sense elements and reference elements have different shape anisotropies such that the sensitivity of the sense elements and the reference elements is different; additionally, wherein the push-pull full-bridge sensor sense elements have a shape anisotropy that controls the magnetization direction of the free layer of said sense elements.

Alternatively, the referenced bridge sensor is a referenced half-bridge sensor, that comprises reference elements and sense elements; and the push-pull sensor is a half-bridge is comprised only of sense elements.

Additionally the single-chip two-axis magnetic field sensor comprises permanent magnets used to create different bias magnetic fields on the reference elements and sense elements of the referenced half-bridge in order to make the sensitivity of the reference elements and sense elements of the referenced half-bridge sensor different, and also to bias the magnetization direction of the free layer of the sense elements of the push-pull half-bridge sensor.

Further, the referenced half-bridge sensor sense elements and reference elements have different shape anisotropies such that the sensitivity of the sense elements and the reference elements is different; additionally, wherein the push-pull half-bridge sensor sense elements have a shape anisotropy that controls the magnetization direction of the free layer of said sense elements.

Preferably, the referenced bridge sensor includes a reference arm and a sense arm.

In a further optimization, the reference arm includes a shield covering the reference elements of in order to lower the sensitivity of the reference elements, said shield is composed of a soft ferromagnetic material with high magnetic permeability.

Preferably, the referenced bridge sense elements include soft ferromagnetic structures in the regions around and between the sense elements in order to increase the sensitivity of the sensing elements.

All of the above preferred refinements of the present invention can be integrated into a single semiconductor chip at low cost.

DETAILED DESCRIPTION OF THE PRESENT INVENTION

DESCRIPTION OF THE PREFERRED EMBODIMENTS

Figure 1:
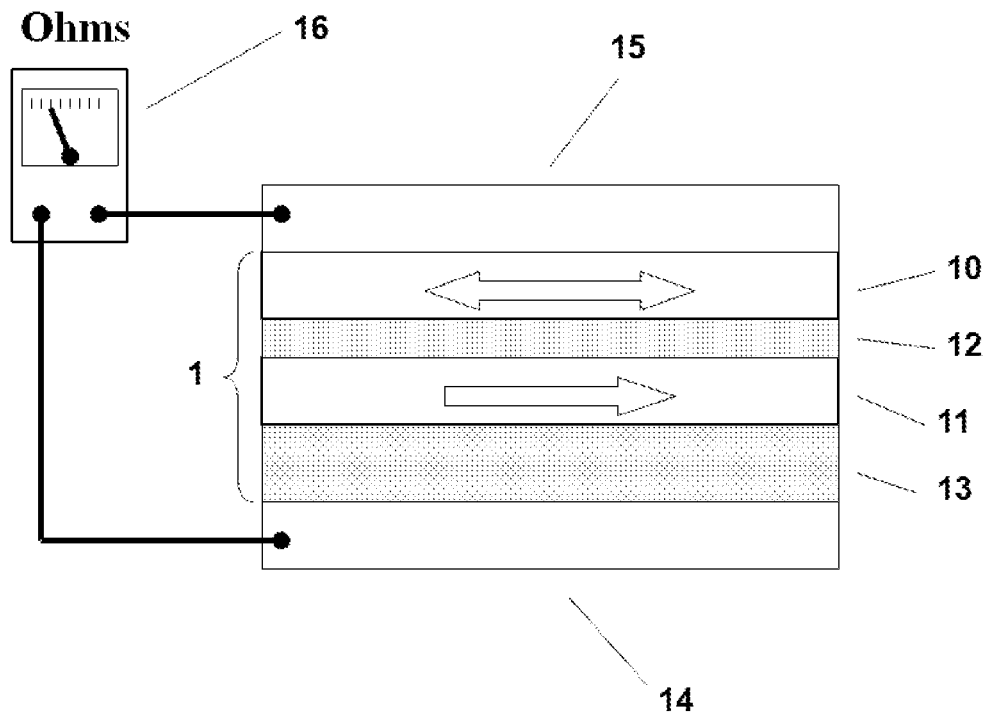
FIG. 1 is a simplified schematic drawing of a magnetic tunnel junction.

FIG. 1 shows a simplified conceptual cross-sectional view of the functional layers in a MTJ element. An MTJ 1 generally includes either an upper ferromagnetic or synthetic antiferromagnetic ("SAF") layer 10, or a lower ferromagnetic or SAF layer 11, and a tunnel barrier layer 12 between the two ferromagnetic layers. In this example, the upper ferromagnetic or SAF layer 10 composes the free magnetic layer because the direction of its magnetization moves in response to an externally applied magnetic field. The lower ferromagnetic or SAF layer 11, however, is the fixed magnetic layer because the direction of its magnetization is pinned in one direction and does not change direction of polarization during normal operating conditions. Pinning is usually accomplished by growing the ferromagnetic or SAF fixed layer on top of or directly beneath an antiferromagnetic layer 13. An MTJ is often grown atop a conducting seed layer 14, and capped with a conducting layer 15. The resistance 16 of the MTJ measured between the seed 14 and capping layer 15 is representative of the relative orientation of the magnetization of the free layer 10 and the pinned layer 11. When the magnetization in upper ferromagnetic or SAF layer 10 is parallel to the magnetization in lower ferromagnetic layer 11, the resistance across cell 16 is in its low resistance state. When the magnetization in upper ferromagnetic layer 10 is anti-parallel to the magnetization in lower ferromagnetic layer 12, the resistance across cell 16 is in its high resistance state. In between the high and low resistance states, the resistance of the MTJ 1 can be made to vary linearly with applied magnetic field using techniques known in the art.

Figure 2:
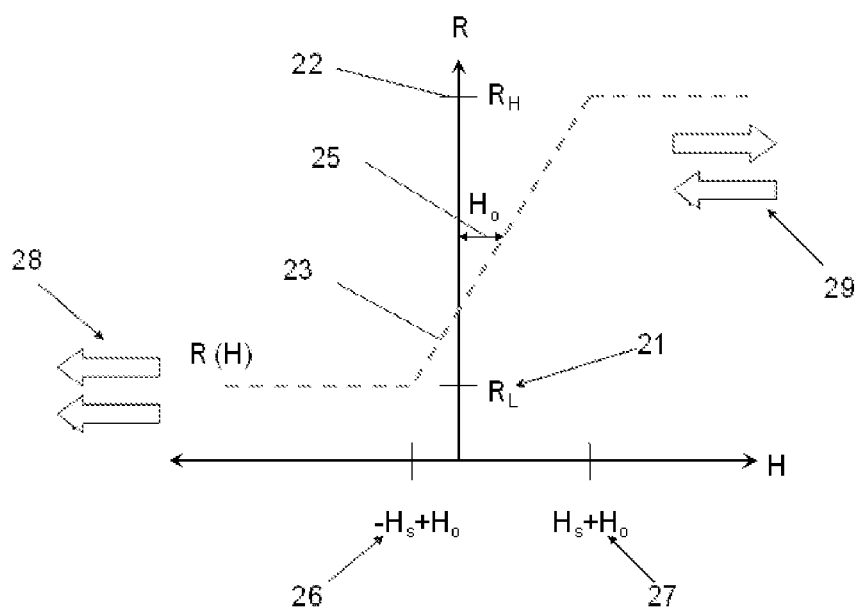
FIG. 2 is a schematic drawing of the magnetoresistive response of a spin-valve sensing element with the reference layer magnetization pointing in the negative H direction.

The general form of the magnetoresistive transfer curve of a GMR or MTJ magnetic sensor element suitable for linear magnetic field measurement is shown schematically in FIG. 2. The transfer curve saturates at low 21 and high 22 resistance values, $R_L$ and $R_H$, respectively. At $R_L$, the pinned and free layer magnetization are aligned 28, and at $R_H$, the pinned and free layer magnetizations are antiparallel 29. In the region between saturation, the transfer curve is linearly dependent on the applied magnetic field, H. The transfer curves are often not symmetric about the H=0 point. The saturation fields 26, 27 are typically offset by an amount $H_o$ 25 such that the $R_L$ saturation region is closer to the H=0 point. The value of $H_o$ 25 which is often referred to as "orange peel" or "Neel coupling," and it typically ranges from 1 to 25 Oe. It is a related to roughness of the ferromagnetic films within the GMR and MTJ structures, and it is dependent on materials and manufacturing processes. In the unsaturated region, the transfer curve may be approximated:

$$R(H) = \frac{R_H - R_L}{2H_s}(H - H_o) + \frac{R_H + R_L}{2} \quad (1)$$

Figure 3:
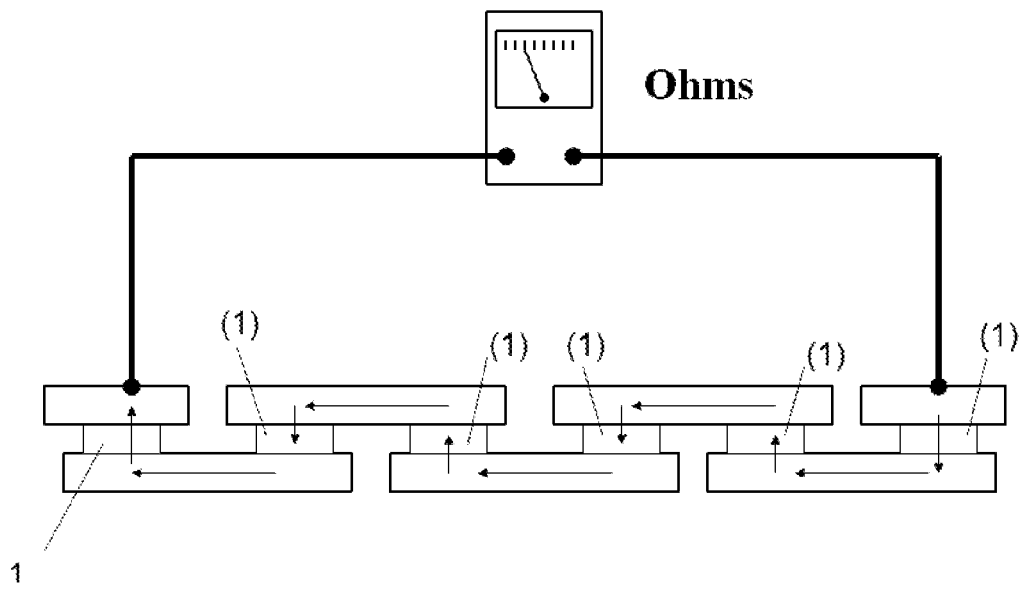
FIG. 3 is an illustration of a technique for combining several magnetic tunnel junctions into a string for use as a magnetoresistive sensing element.

In order to form a Wheatstone bridge, it is desirable that the MTJ elements 1 be interconnected in a chain as shown in FIG. 3. These chains decrease noise and improve the robustness of the sensor. In a long chain, the bias voltage on each MTJ is reduced by the number of junctions in the chain. This reduces the current required to produce a large voltage output, which reduces shot noise, and it increases the robustness of the sensor to electrostatic discharge damage, since each sensor is subject to reduced voltage stress. Moreover, increasing the number of MTJs in the chains reduces noise by averaging out the uncorrelated random behavior of each individual MTJ.

Two different types of full bridge sensors compensate Neel Coupling and provide sensitivity to fields parallel and perpendicular to the magnetization of the pinned layer 11. These will be termed a referenced bridge and a rotated magnetization bridge. Referenced and rotated magnetization bridges will first be described, followed by a method for combining them into a monolithic biaxial sensor.

Figure 4:
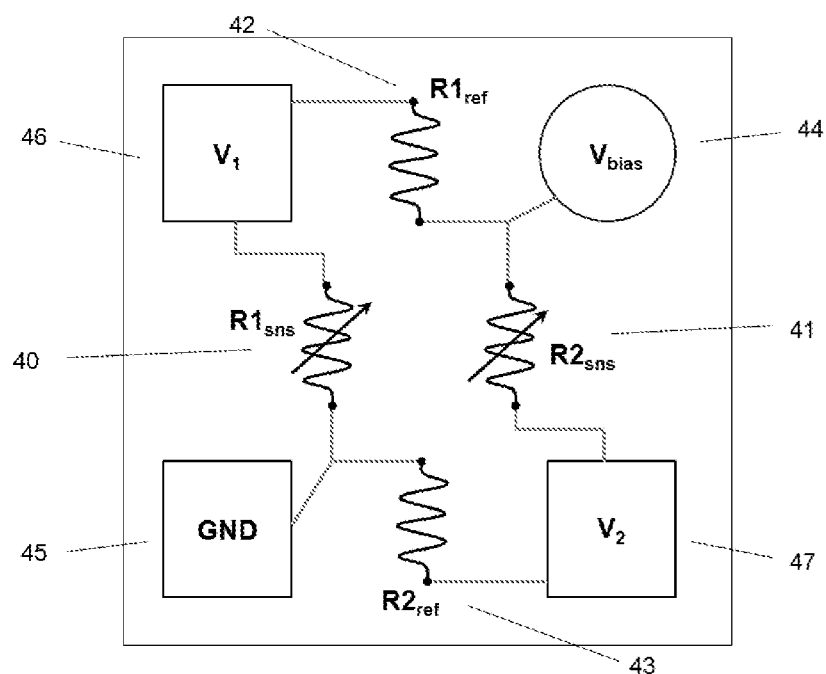
FIG. 4 is a schematic diagram for a referenced full bridge linear magnetoresistive sensor.

Referenced Bridge Sensor:

FIG. 4 shows the schematic diagram for a referenced bridge sensor. Here, two sensor elements have a transfer curve that is strongly dependent on an applied magnetic field; these elements 40 and 41 are referred to as the sensing arms. Two additional sensor elements, 42 and 43, have a transfer curve that is weakly dependent on an applied magnetic field. These elements 42 and 43 are referred to as the reference arms. Additionally, when laid out on a substrate, the sensors need contact pads for voltage bias ($V_{bias}$, 44), ground (GND, 45), and two half bridge center-taps (V1, 46, V2, 47). The voltage at the center-taps is given as:

$$V1(H) = \frac{R1_{sns}(H)}{R1_{sns}(H) + R1_{ref}(H)} V_{bias} \quad (2)$$

-continued $$V2(H) = \frac{R2_{ref}(H)}{R2_{sns}(H) + R2_{ref}(H)} V_{bias} \quad (3)$$

The output of the bridge sensor is defined as:

$$V(H)=V1(H)-V2(H) \quad (4)$$

For the ideal case where $R_L^{ref} \approx R_L^{snsf}$; $R_H^{ref} \approx R_H^{sns}$; $H_o^{ref}=H_o^{sns} \approx 0$, and at $H<H_s^{sns}$, the bridge response is $$V(H) = \frac{\frac{(H_s^{ref} - H_s^{sns})}{H_s^{ref} H_s^{sns}} H}{\frac{(H_s^{ref} + H_s^{sns})}{H_s^{ref} H_s^{sns}} H + 2\frac{(R_H + R_L)}{(R_H - R_L)}} V_{bias} \quad (5)$$

When H meets the following conditions, the output is linear:

$$\left|\frac{(H_s^{ref} + H_s^{sns})}{H_s^{ref} H_s^{sns}} H\right| << \left|2\frac{(R_H + R_L)}{(R_H - R_L)}\right| \quad (6)$$

Assuming "<<" represents an order of magnitude:

$$|H| < \sim \frac{1}{10}\left(2\frac{(R_H + R_L)}{(R_H - R_L)} \frac{H_s^{sns} H_s^{ref}}{(H_s^{sns} + H_s^{ref})}\right) \quad (7)$$

In practice, the linear region is sufficiently wide to produce a good linear sensor. For a sensor with magnetoresistance, $R/R \approx 150\%$ and $H_s^{ref}=130$ Oe$>>H_s^{sns}$. The extent of the linear region of the sensor is thus on the order of:

$$|H_{Linear}| \leq 0.4\, H_s^{sns} \quad (8)$$

Using these typical values, the device will operate as a linear sensor without correction provided $H_s^{sns}$ is approximately 2.5× larger than the desired extent of the linear operating range.

An important consideration in building a bridge sensor is the method used to set the relative sensitivity of the sensor and reference arms of the bridge. The sensitivity of the magnetoresistive elements is defined as the change in resistance as a function of applied magnetic field. This may be expressed as:

$$S_{MTJ} = \frac{1}{2}\left(\frac{R_H - R_L}{R_H + R_L}\right)\left(\frac{V_{bias}}{H_s}\right) \quad (9)$$

It is not practical to reduce the magnetoresistance of the reference arm with respect to the sensor arm, so sensitivity is most easily adjusted by modifying $H_s$. This may be accomplished by one or a combination of several different techniques:

i. Shielding—Here, a high permeability ferromagnetic plate is deposited over top of the reference arms of the bridge in order to attenuate the applied magnetic field.
ii. Shape anisotropy stabilization—The reference and sensor MTJ elements have a different size and thus different shape anisotropy. The most general approach would be to make the reference MTJ elements longer and narrower than the sensor MTJ elements, such that the demagnetizing factor in the direction parallel to the sensing axis is much larger for the reference MTJ elements than it is for the sensing MTJ elements.
iii. Exchange bias—In this technique, an effective field is created in the direction perpendicular to the sensing axis, by exchange coupling the free layer of the MTJ elements to an adjacent antiferromagnetic or permanent magnet layer. It may be desirable to put a thin spacer layer of a material like Cu or Ta between the free layer and the layer to which it is exchange biased in order to reduce the strength of the exchange bias. Representative layering sequences are as follows:
   a. . . . Seed/AF1/FM/Ru/FM/barrier/FM/spacer/AF2/cap . . .
   b. . . . Seed/AF1/FM/Ru/FM/barrier/FM/spacer/PM/cap . . .
   c. . . . Seed/AF1/FM/Ru/FM/barrier/FM/AF2/cap . . .
   d. . . . Seed/AF1/FM/Ru/FM/barrier/FM/PM/cap . . .
   Here, AF1 and AF2 are antiferromagnetic materials, such as PtMn, IrMn, FeMn. FM is used to represent a ferromagnetic layer or multilayer comprised of many different possible ferromagnetic alloys, including but not limited to NiFe, CoFeB, CoFe, and NiFeCo. The barrier may be any insulating material that is compatible with spin polarized tunneling, such as $Al_2O_3$ or MgO. The spacer is generally a nonmagnetic layer, usually a thin layer of Ta, Ru or Cu. The different antiferromagnetic layers, AF1 and AF2 would generally be chosen such that the blocking temperature of AF2 is lower than the blocking temperature of AF1, so that the FM/Ru/FM pinning layer can be set in a direction orthogonal to the exchange bias fields created by FM2 on the free layer.
iv. Magnetic field bias—In this technique, permanent magnet materials, such as alloys of Fe, Co, Cr, and Pt are deposited on the sensor substrate or in the MTJ stack and used to produce a stray field that biases the MTJ element transfer curve. An advantage of permanent magnetic biasing is the permanent magnet can be initialized using a large magnetic field, after the bridge is fabricated. A further and very important advantage, is the bias field can be used to remove domains from the MTJ sensor elements in order to stabilize and linearize their response. These advantages provide great flexibility in tuning the design to account for manufacturing variation as will be discussed. For the in-stack design, the following schematic layering sequence is possible
   . . . Seed/AF1/FM/Ru/FM/barrier/FM/thick-spacer/PM/cap . . .
   The other technique involves the use of biasing magnets side-by-side with the MTJ elements.

The techniques for adjusting sensitivity may be applied individually, or in combination. In particular, it may be desirable to combine several techniques to make $H_s^{ref}$ extremely high, thereby reducing $S_{MTJ}$ of the reference leg providing a very stable reference arm for the bridge sensor.

When using a cross-bias field to set the sensitivity of a MTJ element, the following relationship exists between the cross-bias field, $H_{cross}$, and $H_s$:

$$H_s \approx \frac{2K_s}{M_s} + H_{cross}, \quad (10)$$

where $K_s$ is shape anisotropy of the freelayer, and $M_s$ is the saturation magnetization of he freelayer. Therefore, the sensitivity is inversely dependent on $H_{cross}$ as:

$$S_{MTJ} = \frac{1}{2}\left(\frac{R_H - R_L}{R_H + R_L}\right)\left(\frac{1}{\frac{2K_s}{M_s} + H_{cross}}\right) \quad (11)$$

Figure 5:
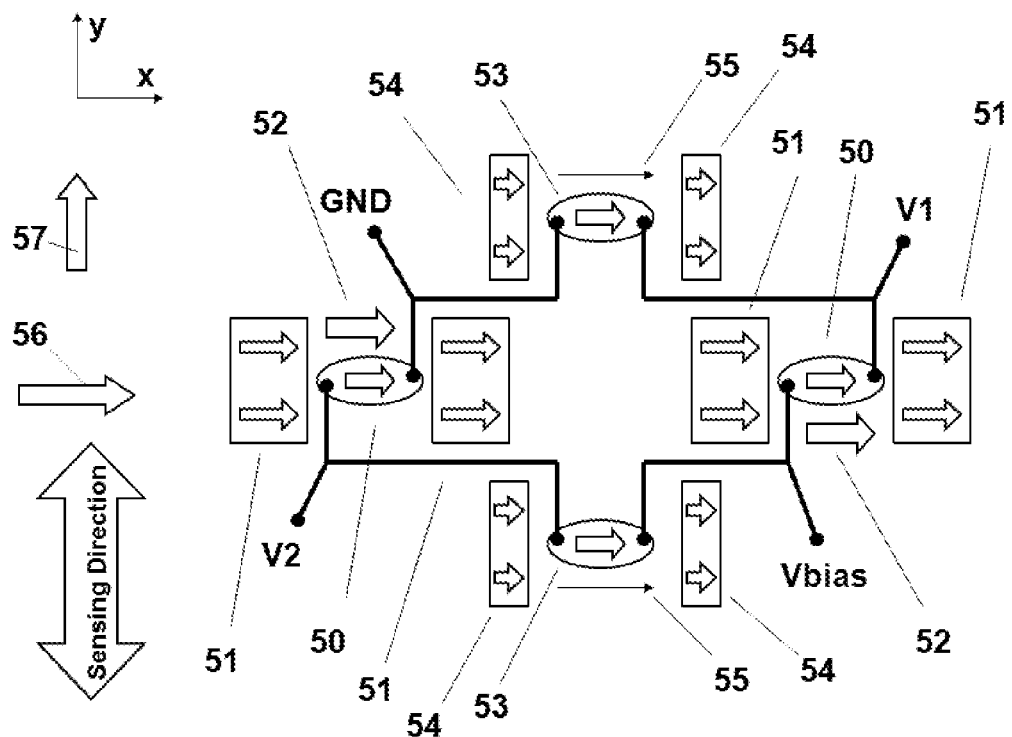
FIG. 5 is an illustration of a referenced full bridge sensor utilizing permanent magnet structures in order to create a cross-bias field.

A preferred method for providing $H_{cross}$ is illustrated in FIG. 5. Here, a magnetoresistive reference sensor 50 is situated in a narrow gap between two wide magnets 51. This arrangement of 50 and 51 produces a large cross-bias field 52 that makes the reference sensors relatively insensitive to applied magnetic fields. The sense MTJ elements 53 are situated in a wide gap between relatively narrow permanent magnets 54, and this produces a weak cross-bias field 55. As expected, the weak cross-bias field 55 results in high sensitivity for the sense MTJ elements. The reference and sense MTJ elements are arranged in a Wheatstone bridge in a manner analogous to that illustrated in FIG. 4. The permanent magnets are initialized in direction 56, and the pinned layer is set in direction 57, perpendicular to the permanent magnet.

Figure 6:
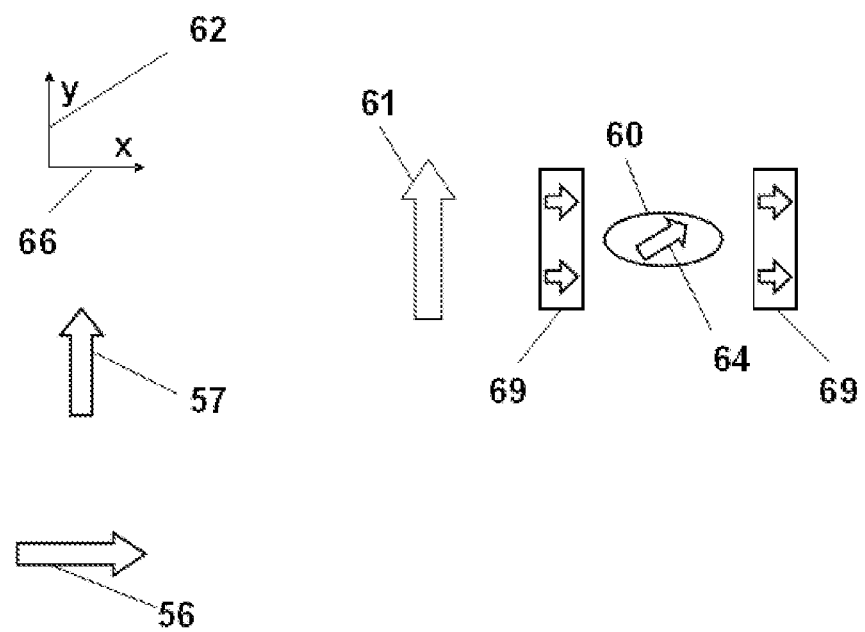
FIG. 6 is a diagram showing that the sensitive direction of referenced sensor bridges is parallel to the pinned layer magnetization set direction.
Figure 7:
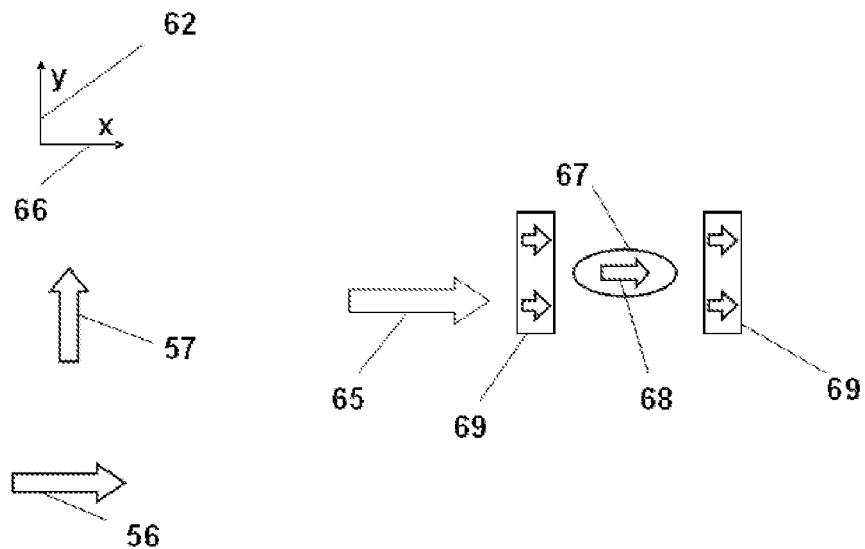
FIG. 7 illustrates a referenced bridge sense element response to a field component perpendicular to the sense direction.

A quick analysis of the referenced bridge sensor arrangement shows that it is sensitive to magnetic fields that are applied along an axis that is parallel to the set direction 57 of the MTJ pinned layer 11 is given in FIGS. 6 and 7.

As shown in FIG. 6, Here a sense element MTJ 60 is exposed to a magnetic field 61 that is parallel to the pinned layer magnetization set direction 57. Because the applied field 61 has a component perpendicular to the magnetization, the magnetization 64 rotates into the direction of the applied field 61. The resistance of the MTJ sense element 60 thus changes because the magnetization rotates with respect to the direction of the pinned layer magnetization 57.

FIG. 7 shows the case of a magnetic field 65 applied parallel to the long axis 66 of the MTJ 67, the magnetization 68, which is aligned along the long axis 66, experiences no torque, because there is no component of the magnetic field 65 perpendicular to the magnetization 68. The resistance of the sense element 67 thus does not change in response to fields applied along the axis 66 that is perpendicular to the pinned layer set direction 57. The referenced bridge of this design is thus only sensitive to fields applied along the axis that is parallel to the pinned layer set direction 57. Note that if permanent magnet 69 bias is used, its magnetization is set predominantly in the direction 66 that is perpendicular to the pinned layer magnetization 57.

Figure 8:
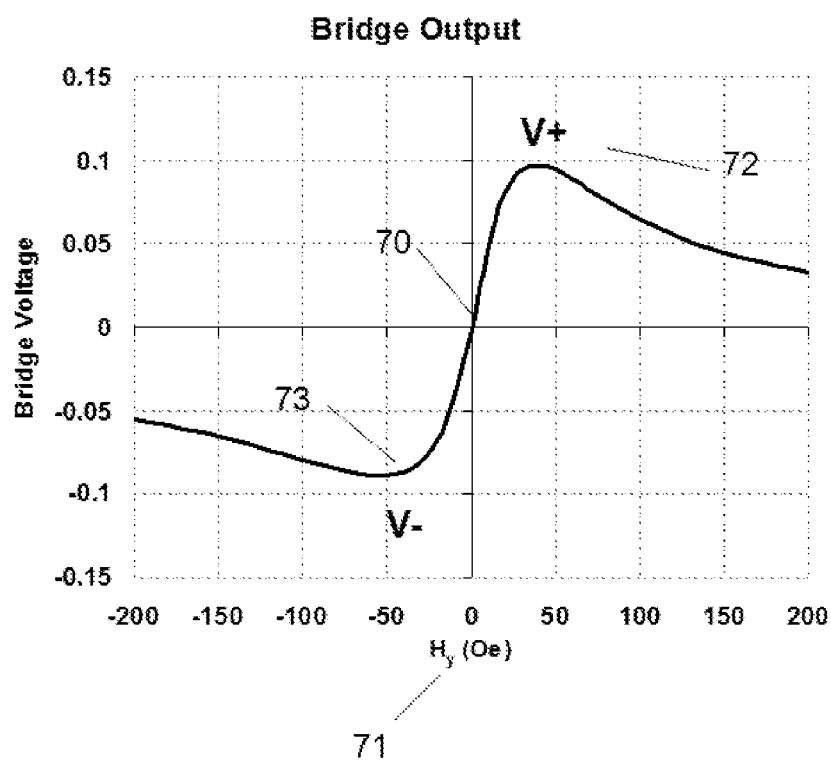
FIG. 8 is an exemplary transfer curve of a referenced full bridge magnetoresistive sensor.

FIG. 8 shows an exemplary transfer curve 70 of the referenced bridge sensor. Note that as the field applied along the pinned layer direction, Hy 71, is ramped from positive to negative, the transfer curve goes through negative 73 and positive 72 peaks. Between 72 and 73, the transfer curve 70 is linear over a large range of applied field 71.

Push-Pull Bridge Sensor:

A push-pull bridge sensor can be built by any of the following or combination of the following methods for biasing the free layer of the sense elements:

Shape anisotropy energy—The MTJ element can use magnetic anisotropy energy to set the direction of the magnetization of the free layer. This is generally accomplished in a MTJ by setting the length so that it is greater than the width, and then the magnetization will prefer to align along the long direction;

Permanent magnet bias—permanent magnets may be placed in the vicinity of the MTJ which can produce a magnetic bias field that aligns the direction of the free layer magnetization;

On-chip coil—a conducting coil may be fabricated in a layer above or below the MTJ through which a current can flow to produce a magnetic field, which can bias the direction of the magnetization of the free layer;

Neel Coupling—Neel the offset field from Neel coupling may be used to bias the direction of the free layer;

Exchange bias—In this method, the MTJ element free layer is weakly exchange coupled to an adjacent antiferromagnetic layer creating an effective. The strength of the bias field can be set by placing a Cu or Ta layer between the free layer and the antiferromagnetic layer in order to reduce the strength of exchange bias For a specific example, refer to patent:

单一芯片桥式传感器, Application Number: CN201120097042.3.

Figure 9:
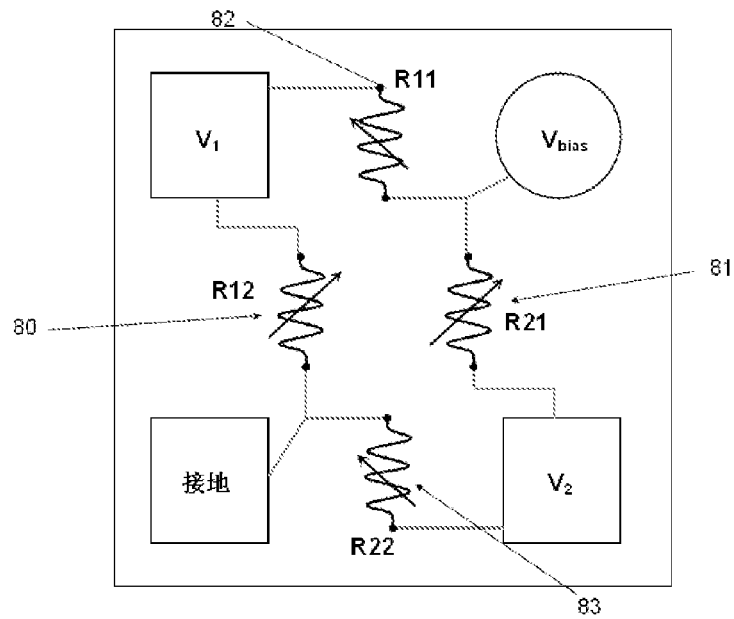
FIG. 9 is a schematic diagram for a push-pull full bridge linear magnetoresistive sensor.

FIG. 9 shows the schematic diagram for a push-pull bridge sensor. Here, two sensor elements R12 80 and R21 81 are rotated with respect to the other sensor elements R11 82 and R22 83 such that an applied magnetic field causes two of the sensors R12 and R21 to increase in resistance, and the other two sensors R22 and R21 to decrease in resistance. This doubles the output of the bridge. Reversing the direction of the applied field changes the response so that the pair R22 and R11 increase while R21 and R12 decrease. The response is still doubled, but the polarity of the output changes. The use of sensor pairs that have opposite response to the measured field—one pushes and the other pulls—to increase the response of a bridge is the reason the bridge is termed "push-pull."

The voltage at the center-taps is given as:

$$V1(H) = \frac{R12(H)}{R11(H) + R12(H)} V_{bias} \quad (12)$$

$$V2(H) = \frac{R22(H)}{R21(H) + R22(H)} V_{bias} \quad (13)$$

The output of the bridge sensor is defined as:

$$V(H) = V1(H) - V2(H) \quad (14)$$

In the push-pull arrangement, the MTJ response for the different elements may be approximated:

$$R11(H) = R22(H) = \frac{R_H - R_L}{2H_s}(-H - H_o) + \frac{R_H + R_L}{2} \quad (15)$$

$$R12(H) = R21(H) = \frac{R_H - R_L}{2H_s}(H - H_o) + \frac{R_H + R_L}{2} \quad (16)$$

then $$V(H) = \left(\frac{R_H - R_L}{R_H + R_L}\right)\left(\frac{H}{H_s}\right) V_{bias} \quad (17)$$

Figure 10:
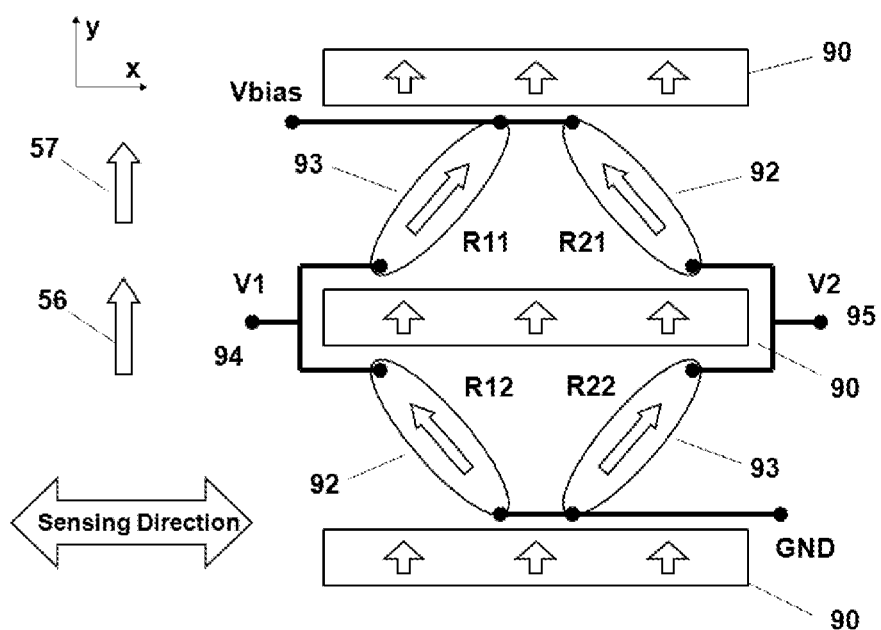
FIG. 10 is a diagram illustrating the sensitive direction of push-pull sensor bridges with rotated equilibrium magnetization to the component of a magnetic field that is applied perpendicular to the axis that the pinned layer magnetization direction.

For the purpose of describing the main features of a rotated magnetization push-pull bridge, the design using rotated MTJ elements and straight permanent magnet bias structures will be discussed. Other implementations, especially those without bias are easier to integrate into a biaxial sensor. The simplified concept is illustrated in FIG. 10. Here, permanent magnet bars 90, have their magnetization aligned along the pinning axis direction 91. Because of this, they provide a bias field on MTJ elements 92 and 93, which causes the free layer magnetization of the MTJ elements 92 and 93 to all have a common component aligned along the pinning direction 91.

In addition to using bias field to align the magnetization, the MTJ elements 92 are rotated about +45° from the pinning direction 91, and MTJ elements 93 are rotated −45° from the pinning direction 91.

Figure 11:
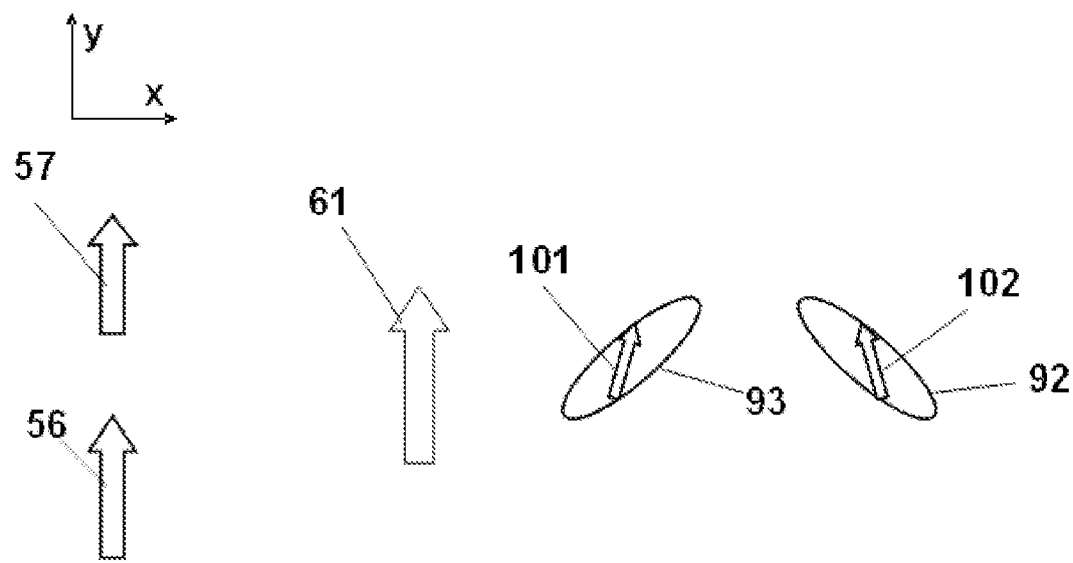
FIG. 11 is a diagram showing the response of a push-pull bridge to a magnetic field aligned parallel to the pinned layer magnetization direction.
Figure 12:
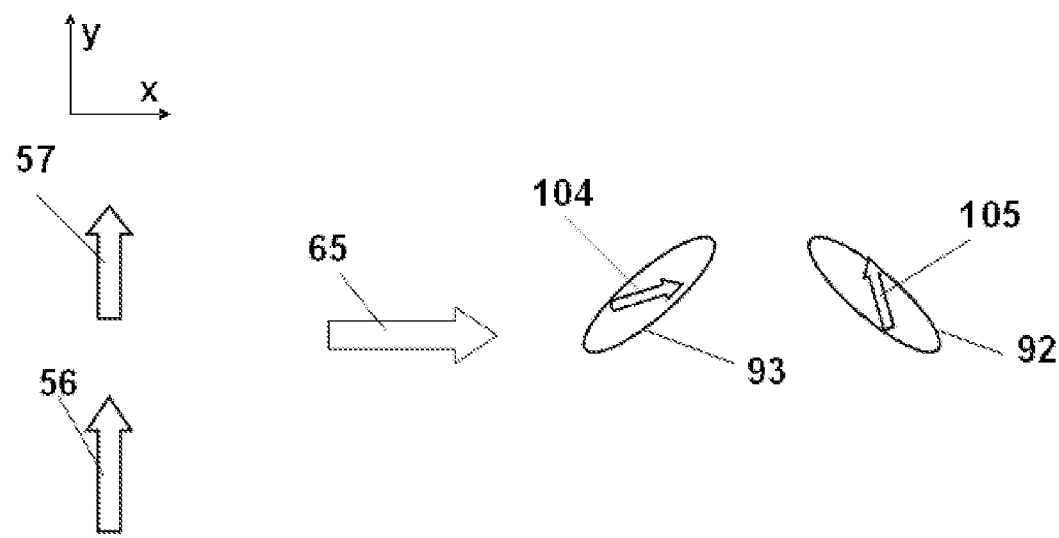
FIG. 12 is a diagram showing the response of a push-pull bridge to a magnetic field aligned perpendicular to the pinned layer magnetization direction.

The push-pull operating principle is explained in FIGS. 11 and 12.

FIG. 11 shows the case where the applied field 61 is parallel to the pinning direction's axis 57. In this case, the magnetizations 101 and 102 of elements 92 and 93 both rotate either towards the direction parallel or antiparallel to the pinned direction, but the same amount. The response causes the resistance of elements 92 and 93 to change by the same amount, which is common mode and produces no change at the output of the bridge sensor. The bridge is thus not sensitive to field components aligned parallel or antiparallel to the pinning axis 57.

If however as shown in FIG. 12, the applied field 65 is perpendicular to the pinning direction 56, then the resistance of elements 92 and 93 produces an additive change. In this case, the magnetizations 104 and 105 rotate such that they form a component of their magnetization that is parallel to the applied field 65. This causes element 93 magnetization to rotate away from the pinning direction 57 and magnetization of element 92 to rotate towards the pinning direction 57. MTJ 93 thus increases in resistance and MTJ 92 decreases in resistance. The resistance changes are no longer common mode, and they add at the output of the bridge. Reversing the direction of the perpendicular applied magnetic field 65 produces an analogous decrease of the resistance in element 93 and increase in element 92, changing the polarity of the bridge output.

The sensitivity equation for rotated sensors needs to be adjusted relative to the transfer curve measured along an axis parallel or perpendicular to the pinned layer by a factor $\beta \approx \frac{1}{2}$, since the range of motion of the magnetization in the free layer is reduced by the rotation of the MTJ with respect to the pinned layer, reducing the maximum possible voltage output.

$$V(H) = \beta \left(\frac{R_H - R_L}{R_H + R_L}\right)\left(\frac{H}{H_s}\right) V_{bias} \leq \left(\frac{1}{2}\right)\left(\frac{R_H - R_L}{R_H + R_L}\right)\left(\frac{H}{H_s}\right) V_{bias} \qquad (18)$$

This equation (18) is close to the referenced bridge sensitivity, which makes the design compatible for use on the same substrate as a referenced bridge.

Figure 13:
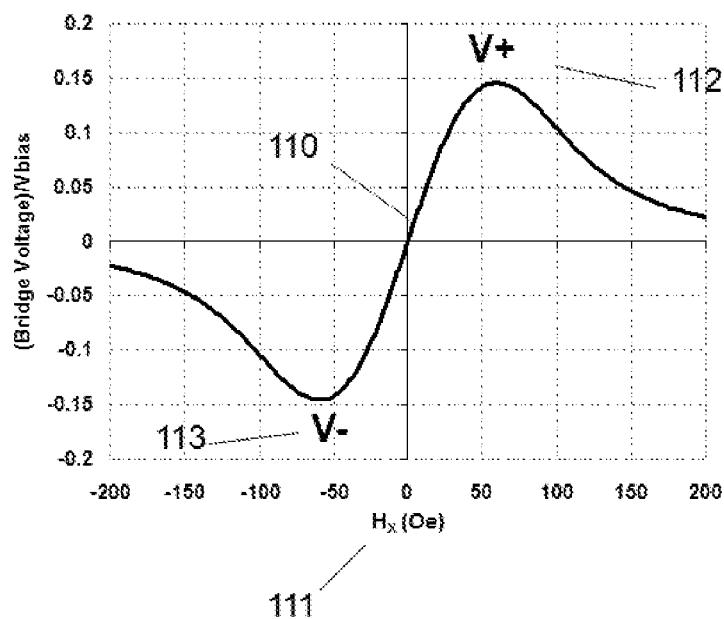
FIG. 13 is an exemplary transfer curve of the push-pull full bridge magnetoresistive sensor.

A representative transfer curve 110 for the push-pull bridge is shown in FIG. 13. Note that as the field applied perpendicular to the pinned layer direction, Hx 111, is ramped from positive to negative, the transfer curve goes through negative 112 and positive 113 peaks. Between 112 and 113, the transfer curve 110 is linear. This response is identical to that of the referenced bridge, except that the sensitive axis is rotated. This observation permits the development of a monolithic biaxial bridge magnetic field sensor using referenced and rotated magnetization bridges composed of GMR or MTJ magnetic field sensing elements. Dual axis designs without using a bias field are straightforward, since the pining direction is common to the referenced and rotated bridges, so the following description considers the case using permanent magnet bias.

Figure 14:
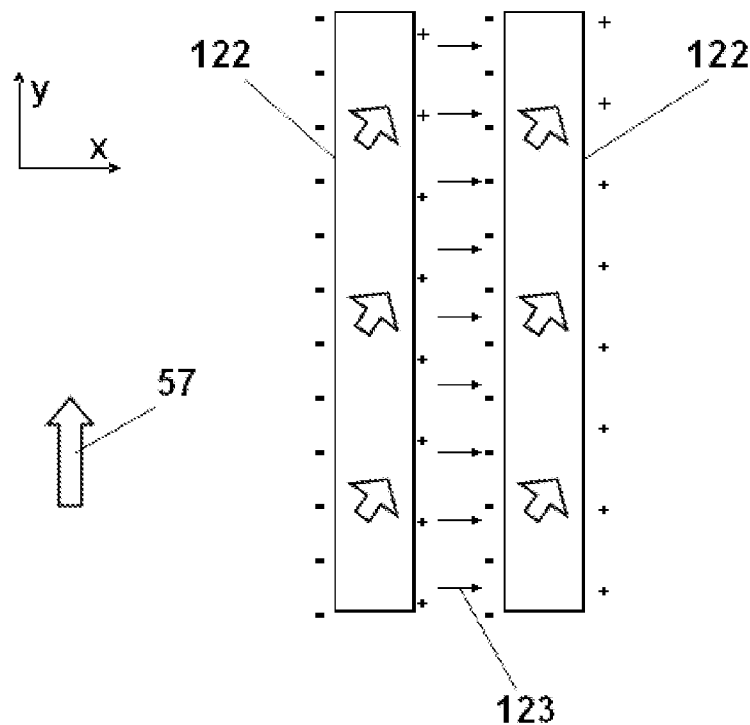
FIG. 14 is a drawing showing the direction of the permanent magnet bias field when the magnetization of the permanent magnets is aligned at 45 degrees.
Figure 15:
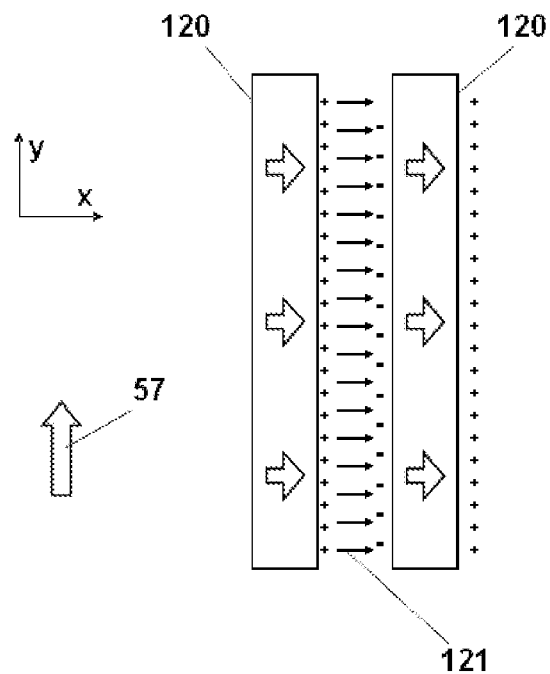
FIG. 15 is a drawing showing the direction of the permanent magnet bias field when the magnetization of the permanent magnets is aligned at 0 degrees.

Single-Chip Two-Axis Sensor Design:

The field from the permanent magnets can be considered to be due to virtual magnetic charges that form at the edge of the permanent magnet plates as a result of boundary conditions on the magnetization as illustrated in FIGS. 14 and 15. The charges vary with magnitude and orientation of the remanent magnetization "$M_r$" with respect to the orientation of the edge of the permanent magnet slab.

$$\rho_s = M_\gamma \cos(\theta_{Mag}) \text{ or } \rho_s = M_\gamma \cos(\theta_{Mag}) \qquad (19)$$

These virtual charges produce a magnetic field according to:

$$\vec{H}(\vec{r}) = 4\pi \int_{surface} \frac{\rho_s}{(\vec{r} - \vec{r}\,')^2} dS' \qquad (20)$$

Between the permanent magnet slabs 120 and 122, the direction of the field is determined by the location of the charges, and not the direction of the remanent magnetization of the permanent slabs. Only the magnitude of the bias field 121 and 123 is determined by the orientation of the magnetization 120 and 122 of the permanent magnet slabs. This trick allows the construction of a permanent magnet biased biaxial magnetic field sensor.

Figure 16:
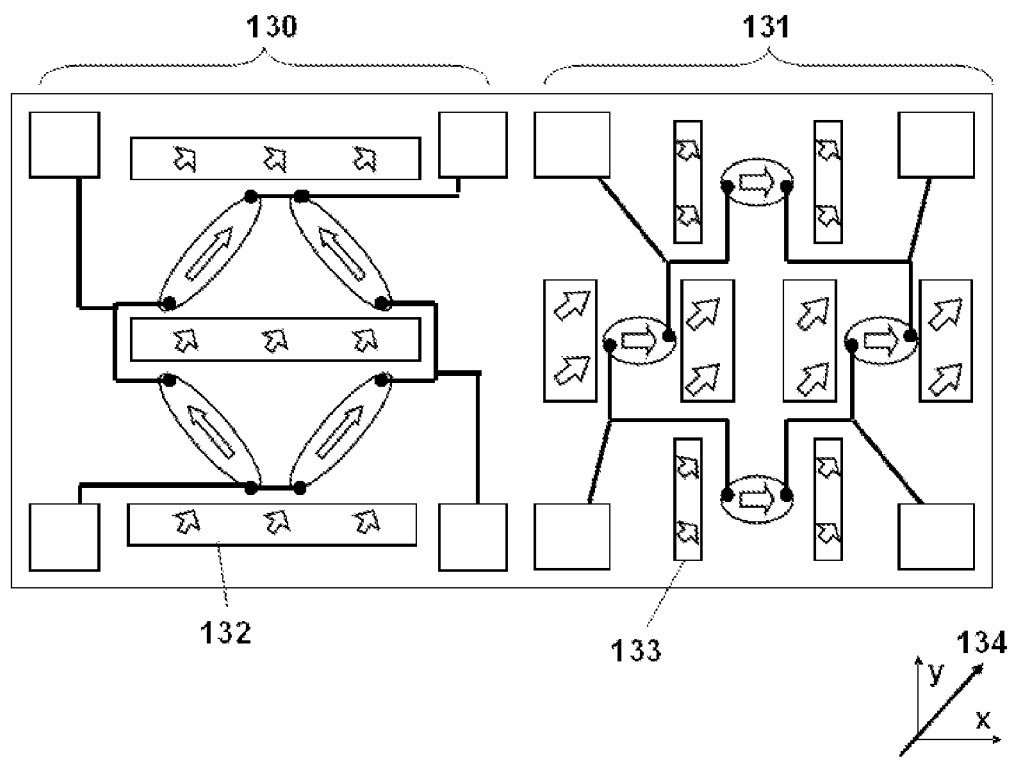
FIG. 16 is a conceptual die layout utilizing both referenced and push-pull full bridge sensors in order to produce a monolithic biaxial magnetic field sensor.

FIG. 16 shows the simplified concept of a permanent-magnet-biased, two-axis, magnetic field sensor. It is possible to place both a push-pull bridge 130 and referenced bridge 131 side-by-side on the same substrate, and to manufacture them simultaneously using the identical process steps. In this design, the permanent magnet bars of the push-pull bridge 132 are rotated by 90° with respect to the permanent magnet bars of the referenced bridge 133. Then if the permanent magnet is set at 45° with respect to the pinning direction, proper permanent magnet bias can be obtained in both bridge sensors 130 and 131. The push-pull bridge 130 is sensitive to a magnetic field 134 component along the X axis, and the referenced bridge 131 is sensitive to a component magnetic field 134 along the Y axis direction.

Utilizing the concepts presented above, a single-chip, two-axis magnetic sensor can be realized.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

The invention claimed is:

1. A single-chip two-axis magnetic field sensor, comprising:
   a semiconductor substrate;
   two mutually orthogonal sensing axes, the X-axis and the Y-axis;
   a referenced bridge sensor integrated on the semiconductor substrate, the referenced bridge sensor having a sensitive direction along the Y-axis, wherein the referenced bridge comprises reference elements and sense elements, wherein the sense elements have a magnetoresistive transfer curve strongly dependent on applied magnetic fields and the reference elements have a magnetoresistive transfer curve weakly dependent on an applied magnetic field;
   a push-pull bridge sensor integrated on the semiconductor substrate, the push-pull bridge sensor having a sensitive direction along the X-axis, wherein the push-pull bridge is comprised only of sense elements; and each of the reference elements and each of the sense elements including a magnetic sensor element, the magnetic sensor element being either a tunneling magnetoresistance (TMR) element or a giant magnetoresistance (GMR) element, wherein the magnetic sensor elements in the referenced bridge sensor and the magnetic sensor elements in the push-pull bridge sensor have a common pinning direction, and wherein a technique is implemented to reduce sensitivity of the reference elements to applied magnetic fields such that the reference elements have the magnetoresistive transfer curve weakly dependent on the applied magnetic field, the technique being selected from the group of techniques consisting of: shielding, shape anistropy stabilization, exchange bias, and magnetic field bias.

2. The single-chip two-axis magnetic field sensor of claim 1, wherein the referenced bridge sensor is a full-bridge sensor and the push-pull bridge sensor is a full bridge sensor.

3. The single-chip two-axis magnetic field sensor of claim 2, further comprising permanent magnets used to create different bias magnetic fields on the reference elements and sense elements of the referenced bridge in order to make the sensitivity of the reference elements and sense elements of the referenced full-bridge sensor different, and also to bias the magnetization directions of free layers of the sense elements of the push-pull full-bridge sensor.

4. The single-chip two-axis magnetic field sensor of claim 2, wherein the sense elements and the reference elements of the referenced full bridge sensor have different shape anisotropy such that the sensitivity of the sense elements and the reference elements is different, and wherein the sense elements of the push-pull full bridge sensor have shape anisotropy that control the magnetization directions of the free layers of the sense elements.

5. The single-chip two-axis magnetic field sensor of claim 2, further comprising the permanent magnets to create bias fields, wherein the combined effect of the permanent magnet bias fields and the shape anisotropy of the sense elements and the reference elements in the referenced full-bridge sensor causes the sensitivities of the sense elements and the reference elements to be different, wherein the combined effect of the permanent magnet bias field and the shape anisotropy of the sense elements of the push-pull full-bridge sensor sets the magnetization directions of free layers of the sense elements of the push-pull full-bridge sensor.

6. The single-chip two-axis magnetic field sensor of claim 1, wherein the referenced bridge sensor is a half-bridge sensor and the push-pull bridge sensor is a half-bridge sensor.

7. The single-chip two-axis magnetic field sensor of claim 6, further comprising permanent magnets used to create different bias magnetic fields on the reference elements and the sense elements of the referenced half-bridge in order to make the sensitivity of the reference elements and sense elements of the referenced half-bridge sensor different, and also to bias the magnetization directions of free layers of the sense elements of the push-pull halfbridge sensor.

8. The single-chip two-axis magnetic field sensor of claim 6, wherein the referenced half-bridge sensor sense elements and reference elements have different shape anisotropy such that the sensitivity of the sense elements and the reference elements is different, wherein the push-pull half-bridge sensor sense elements have shape anisotropy that controls the magnetization directions of free layers of the sense elements.

9. The single-chip two-axis magnetic field sensor of claim 6, further comprising permanent magnets to create bias fields, wherein the combined effect of the bias fields and the shape anisotropy of the sense elements and the reference elements in the referenced half-bridge sensor causes the sensitivities of the sense elements and the reference elements to be different, wherein the combined effect of the permanent magnet bias fields and the shape anisotropy of the sense elements of the push-pull half-bridge sensor sets the magnetization directions of free layers of the sense elements of the push-pull half-bridge sensor.

10. The single-chip two-axis magnetic field sensor of claim 1, further comprising a shield covering the reference elements of the referenced bridge sensor in order to lower the sensitivity of the reference elements, wherein the shield is comprised of a soft ferromagnetic material with high magnetic permeability.

11. The single-chip two-axis magnetic field sensor of claim 1, further comprising soft ferromagnetic structures in the regions around and between the sense elements of the referenced bridge-type sensor in order to increase the sensitivity of the sensing elements.

12. The single-chip two-axis magnetic field sensor of claim 1, wherein of the magnetic sensor elements in both the referenced bridge sensor and the push-pull bridge sensor have pinning layers with magnetization initialized in a same direction.

13. A sensor, comprising:
a substrate; and
magnetic sensor elements fabricated on the substrate, the magnetic sensor elements being either tunneling magnetoresistance (TMR) elements or giant magnetoresistance (GMR) elements, the magnetic sensor elements fabricated on the substrate forming a referenced bridge sensor and forming a push-pull bridge sensor,
wherein the referenced bridge sensor has a sensitive direction along a first axis and the push-pull bridge sensor has a sensitive direction along a second axis, the second axis being orthogonal to the first axis,
wherein the magnetic sensing elements forming the referenced bridge sensor including reference elements and sense elements, and the magnetic sensing elements forming the push-pull bridge sensor including only sense elements, wherein the sense elements have a magnetoresistive transfer curve strongly dependent on applied magnetic fields and the reference elements have a magnetoresistive transfer curve weakly dependent on an applied magnetic field, and
wherein the magnetic sensor elements have a common pinning direction for all of the magnetic sensor elements in both of the referenced bridge sensor and the push-pull bridge sensor, and wherein a technique is implemented to reduce sensitivity of the reference elements to applied magnetic fields such that the reference elements have the magnetoresistive transfer curve weakly dependent on the applied magnetic field, the technique being selected from the group of techniques consisting of: shielding, shape anistropy stabilization, exchange bias, and magnetic field bias.

14. The sensor of claim 13, wherein the magnetic sensor elements are TMR elements.

15. The sensor of claim 13, wherein the magnetic sensor elements are GMR elements.

16. The sensor of claim 13, wherein:
the referenced bridge sensor includes permanent magnets to bias each magnetic sensor element in the referenced bridge sensor in a direction orthogonal to the sensitive direction along the first axis; and the push-pull bridge sensor includes permanent magnets to bias each magnetic sensor element in the push-pull bridge sensor in a direction orthogonal to the sensitive direction along the second axis.

17. The sensor of claim 16, wherein each of the magnetic sensors includes a free ferromagnetic layer and a fixed ferromagnetic layer, wherein the fixed ferromagnetic layer is pinned in the common pinning direction, and wherein the permanent magnets bias magnetization directions of the free layers of the magnetic sensors.

18. The sensor of claim 16, wherein each of the magnetic sensors includes a free ferromagnetic layer and a fixed magnetic layer, wherein the fixed ferromagnetic layer is pinned in the common pinning direction, and wherein the magnetic sensors have shape anisotropy to control magnetization directions of the free layers of the magnetic sensors.

19. The sensor of claim 13, wherein the referenced bridge sensor is a full-bridge sensor and the push-pull bridge sensor is a full bridge sensor.

20. The sensor of claim 13, wherein the referenced bridge sensor is a half-bridge sensor and the push-pull bridge sensor is a half-bridge sensor.

* * * * *

UNITED STATES PATENT AND TRADEMARK OFFICE
CERTIFICATE OF CORRECTION

PATENT NO. : 9,575,143 B2  
APPLICATION NO. : 14/110106  
DATED : February 21, 2017  
INVENTOR(S) : Deak et al.

Page 1 of 1

It is certified that error appears in the above-identified patent and that said Letters Patent is hereby corrected as shown below:

On the Title Page

In item (30), in "Foreign Application Priority Data", in Column 1, Line 1, delete "2011 1 0084594" and insert --2011 1 0084594.5-- therefor In item (30), in "Foreign Application Priority Data", in Column 1, Line 2, delete "2011 1 0315913" and insert --2011 1 0315913.9-- therefor In the Claims In Column 11, Line 16, in Claim 1, delete "anistropy" and insert --anisotropy-- therefor In Column 11, Line 59, in Claim 7, delete "halfbridge" and insert --half-bridge-- therefor In Column 12, Line 59, in Claim 13, delete "anistropy" and insert --anisotropy-- therefor Signed and Sealed this  
Nineteenth Day of June, 2018

Andrei Iancu  
*Director of the United States Patent and Trademark Office*